US007923367B2

(12) United States Patent
Machida

(10) Patent No.: US 7,923,367 B2
(45) Date of Patent: Apr. 12, 2011

(54) MULTILAYER WIRING SUBSTRATE MOUNTED WITH ELECTRONIC COMPONENT AND METHOD FOR MANUFACTURING THE SAME

(75) Inventor: Yoshihiro Machida, Nagano (JP)

(73) Assignee: Shinko Electric Industries Co., Ltd., Nagano-shi, Nagano (JP)

( * ) Notice: Subject to any disclaimer, the term of this patent is extended or adjusted under 35 U.S.C. 154(b) by 269 days.

(21) Appl. No.: 11/907,889

(22) Filed: Oct. 18, 2007

(65) Prior Publication Data

US 2008/0099911 A1 May 1, 2008

(30) Foreign Application Priority Data

Oct. 20, 2006 (JP) ................................ P2006-286300

(51) Int. Cl.
*H01L 21/4763* (2006.01)

(52) U.S. Cl. ......................... 438/637; 438/618; 438/622

(58) Field of Classification Search .................. 438/618, 438/622, 637
See application file for complete search history.

(56) References Cited

U.S. PATENT DOCUMENTS 5,237,204 A 8/1993 Val
2004/0007770 A1 1/2004 Kurihara

FOREIGN PATENT DOCUMENTS

| | | |
|---|---|---|
| CN | 1412838 | 4/2003 |
| JP | 8-321567 | 12/1996 |
| JP | 11-126978 | 5/1999 |
| JP | 2001-313474 | 11/2001 |
| JP | 2005-45013 | 2/2005 |
| JP | 2006-165333 | 6/2006 |
| WO | 00/79845 | 12/2000 |

*Primary Examiner* — Long Pham

(74) *Attorney, Agent, or Firm* — Drinker Biddle & Reath LLP

(57) ABSTRACT

A multilayer wiring substrate mounted with an electronic component includes an electronic component, a core material layer having a first opening for accommodating the electronic component, a resin layer which is formed on one surface of the core material layer and which has a second opening greater than the first opening, a supporting layer which is formed on the other surface of the core material layer and which supports the electronic component, a plurality of connection conductor sections which are provided around the first opening and within the second opening on the one surface of the core material layer, bonding wires for electrically connecting the electronic component to the connection conductor sections, and a sealing resin filled into the first and second openings in order to seal the electronic component and the bonding wires.

9 Claims, 9 Drawing Sheets

46 46a 42 44 34 48 48a 14b
16
14b

MULTILAYER WIRING SUBSTRATE MOUNTED WITH ELECTRONIC COMPONENT AND METHOD FOR MANUFACTURING THE SAME

This application claims priority to Japanese Patent Application No. 2006-286300, filed Oct. 20, 2006, in the Japanese Patent Office. The priority application is incorporated by reference in its entirety.

TECHNICAL FIELD

The present disclosure relates to a multilayer wiring substrate mounted with an electronic component and a method for manufacturing the substrate. Particularly, the present disclosure relates to a multilayer wiring substrate mounted with an electronic component in which a plurality of electrode terminals of the electronic component and a plurality of connection conductor sections of a substrate main body are connected together by means of wire bonding, as well as to a method for manufacturing the same.

RELATED ART

Wiring substrates, such as those described in connection with Patent Documents 1 through 3 provided below, have hitherto been known as a wiring substrate with built-in electronic components such as semiconductor elements. However, in relation to the related-art wiring substrate with built-in electronic components, a configuration for preferably incorporating electronic components to be connected to a wiring pattern by means of wire bonding has never been described.

Techniques described in Patent Documents 1 through 3 are available as the related-art technique relevant to the present invention. Patent Document 1 (Japanese Patent Unexamined Publication No. 11-126978) describes a multilayer wiring substrate on which electric elements, such as semiconductor elements, capacitors, and resistive elements, are mounted and which enables miniaturization and enhanced packaging density of electric elements and an increase in the density of a wiring circuit layer. According to Patent Document 1, a multilayer wiring substrate includes an insulating substrate into which a plurality of insulating layers, including a thermosetting resin, are stacked; a plurality of wiring circuit layers formed on and within the insulating substrate; and via hole conductors which are formed by filling metal powder and intended for interconnecting semiconductor layers. In this multilayer wiring substrate, a wiring core substrate is formed by forming cavities within the insulating substrate and housing the electric elements in the cavities. Then, according to a build-up method, the insulating layer containing a photosensitive resin and the wiring circuit layer made by a thin film formation method are sequentially stacked, in a mounted manner, on the surface of the wiring core substrate.

Patent Document 2 (Japanese Patent Unexamined Publication No. 2001-313474) discloses a wiring substrate which incorporates electronic components in a wiring substrate main body via a resin and in which electrical conduction between the electronic components and an internal wiring layer can be established stably, reliably without involvement of cracking or breakage of the resin or the wiring substrate. In Patent Document 2, there are provided through holes for penetrating the wiring substrate main body and insulating layers which are stacked on the front and rear surfaces of the substrate main body by way of wiring layers. At the time of formation of electronic components which are to be incorporated in the through holes and which are fixed by way of the resin, a coefficient of thermal expansion (a1) of the wiring substrate main body, a coefficient of thermal expansion (a2) of the resin, and a coefficient of thermal expansion (a3) of the electronic components are set in such a way that a relationship of $a3 < a1 \leqq a2$ is attained.

Patent Document 3 (Japanese Patent Unexamined Publication No. 2005-45013) describes a circuit module which assumes a cavity structure and which enables higher-density packaging, a higher-speed operation, and a higher-frequency operation. In Patent Document 3, the circuit module has a structure formed from a ceramic multilayer substrate and a resin wiring substrate. In the ceramic multilayer substrate, electronic components are mounted in a cavity, a gap between the electronic components and the cavity is filled with a thermosetting resin, and the surface of the ceramic multilayer substrate is made to be smooth. In the resin wiring substrate, openings are formed in an insulating adhesive layer and a conductive resin is filled in the openings. The resin substrate and the ceramic multilayer substrate are bonded together by means of the insulating adhesive layer, and an upper wiring layer on the ceramic multilayer substrate and the conductive resin are electrically connected together.

As mentioned above, in the related-art wiring substrate in which the electronic components and the wiring substrate main body are electrically connected together by means of wire bonding, wires assume a looped shape between the electronic components and the substrate because of wire bonding. Therefore, a sealing section, or the like, requires a thickness for housing the loops, which in turn hinders miniaturization of a module substrate during formation thereof.

Moreover, the surface of the formed resin sealing material layer has a low degree of smoothness, and mounting electronic components, such as surface mount devices, on the sealing material layer is impracticable.

In any of Patent Documents 1 through 3, a contrivance has been made to a multilayer wiring substrate mounted with electronic components, in terms of the reduction of the thickness of a multilayer substrate, prevention of deformation of the substrate attributable to a difference among coefficients of thermal expansion of various materials, and the like. However, in connection with a multilayer wiring substrate in which electronic components are mounted on a wiring substrate and in which the electronic components and conductor sections for connection purpose (hereinafter called "connection conductor sections") of the substrate are electrically connected by means of wire bonding, the multilayer wiring substrate which achieves a sufficient reduction in thickness has never been disclosed.

SUMMARY

Exemplary embodiments of the present invention provide a multilayer wiring substrate which enables appropriate incorporation of an electronic component in a wiring substrate main body even in the case of the multilayer wiring substrate formed by electrically connecting the electronic component to the wiring substrate main body by wire bonding and can have the reduced thickness.

According to one or more embodiments of the present invention, a multilayer wiring substrate mounted with an electronic component comprises:

an electronic component;

a core material layer which has a first opening for accommodating the electronic component;

a resin layer which is formed on one surface of the core material layer and which has a second opening greater than the first opening;

a plurality of connection conductor sections which are provided around the first opening and within the second opening on the one surface of the core material layer;

bonding wires for electrically connecting the electronic component to the connection conductor sections;

a sealing resin filled into the first and second openings in order to seal the electronic component and the bonding wires; and a wiring pattern formed on the sealing resin.

As mentioned above, according to the multilayer wiring substrate mounted with an electronic component, the electronic component, such as an integrated circuit, is accommodated in the first opening of the core material layer. The electronic component is electrically connected to the connection conductor sections by means of wire bonding and by utilization of the second opening of the resin layer. Hence, when compared with a case where electronic component is mounted directly on the upper surface of the core material layer and connected by means of wire bonding, the thickness of the multilayer wiring substrate mounted with an electronic component can be reduced significantly, thereby forming a thin module substrate.

The multilayer wiring substrate mounted with an electronic component may further comprise:

a second resin layer which is formed on the other surface of the core material layer and which has a third opening which is the same size as the first opening and which is brought into alignment with the first opening, wherein the electronic component is accommodated in an opening formed from the first and third openings.

In this case, the electronic component is accommodated in the opening formed from the first opening of the core material layer and the third opening of the second resin layer. Even when the thickness of the core material layer is constant, the thickness of the second resin layer is adjusted according to the thickness of the electronic component, so that the electronic component can be accommodated in the depth of the opening formed from the first opening and the third opening.

In the multilayer wiring substrate mounted with an electronic component, the bonding wires may be formed into a loop shape between the electronic component and the connection conductor sections, and the uppermost ends of the respective loops may be situated in the respective second opening.

As mentioned above, the topmost ends of the loops of the respective bonding wires are situated within the second opening, whereby the electronic component and the bonding wire can be completely sealed when the opening are filled with a resin.

According to one or more embodiment of the present invention, a multilayer wiring substrate mounted with an electronic component comprises:

an electronic component;

a core material layer which has a first opening for accommodating the electronic component;

a resin layer which is formed on one surface of the core material layer and which has a second opening greater than the first opening;

a supporting layer which is formed on the other surface of the core material layer and which supports the electronic component;

a plurality of connection conductor sections which are provided around the first opening and within the second opening on the one surface of the core material layer;

bonding wires for electrically connecting the electronic component to the connection conductor sections; and a sealing resin filled into the first and second openings in order to seal the electronic component and the bonding wires.

Further, the electronic component may be bonded to the supporting layer by way of an adhesive film. Moreover, the supporting layer supporting the electronic component may be copper foil.

The electronic component may include an upper semiconductor chip and a lower semiconductor chip, which are stacked, the upper semiconductor chip may have electrode terminals which are formed on an upper surface and which are electrically connected to the connection conductor sections by means of the bonding wires, and the lower semiconductor chip may have connection terminals which are formed on a lower surface and which are connected to connection pads formed in the sealing resin.

Thus, even when the electronic component is formed from stacked two semiconductor chips, the electronic component is accommodated in the first opening without fail. The upper semiconductor chip and the connection conductor sections are electrically connected together by means of wire bonding and by utilization of the second opening of the resin layer. Further, the lower semiconductor chip is connected to the connection pads formed on the supporting layer. Hence, the thickness of the multilayer wiring substrate mounted with an electronic component can be reduced.

Further, according to one or more embodiments of the present invention, a method for manufacturing a multilayer wiring substrate mounted with an electronic component, comprises the steps:

preparing a plate-like core material layer having a wiring and a first opening, the wiring including a plurality of connection conductor sections formed around the first opening on one surface of the core material layer;

forming, on the one surface of the core material layer, a resin layer having a second opening which is greater than the first opening in such a way that the plurality of connection conductor sections are exposed within the second opening;

bonding a supporting layer to the other surface of the core material layer;

mounting the electronic component on a surface of the supporting layer within the first opening;

electrically connecting the electronic component to the plurality of connection conductor sections by means of bonding wires; and filling the first and second openings with a resin in order to seal the electronic component and the bonding wires.

According to the method for manufacturing a multilayer wiring substrate mounted with an electronic component, an electronic component, such as an integrated circuit, is accommodated in the first opening of the core material layer. The electronic component is electrically connected to the connection conductor sections by means of wire bonding and by utilization of the second opening of the resin layer. Hence, there can be manufactured the multilayer wiring substrate mounted with an electronic component whose thickness is considerably reduced when compared with a case where an electronic component is mounted directly on the upper surface of the core material layer and connected by means of wire bonding.

The method for manufacturing a multilayer wiring substrate mounted with an electronic component may further comprises a step or:

forming a second resin layer having a third opening which is the same size as the first opening on the other surface of the core material layer in such a way that the third opening is aligned to the first opening, wherein the supporting layer is bonded to the second resin layer, and the electronic component is accommodated in an opening formed from the first and third openings.

In this case, the electronic component is accommodated in the opening formed from the first opening of the core material layer and the third opening of the second resin layer. Even when the thickness of the core material layer is constant, the thickness of the second resin layer is adjusted according to the thickness of the electronic component, so that the electronic component can be accommodated in the depth of the opening formed from the first opening and the third opening. Hence, the multilayer wiring substrate mounted with an electronic component whose thickness is considerably reduced can be manufactured.

In the step of electrically connecting the electronic component to the plurality of connection conductor sections by means of bonding wires, the electronic component may be connected in such a way that topmost ends of respective loops of the bonding wires are situated below an upper surface of the second opening.

As mentioned above, the topmost ends of the loops of the respective bonding wires are situated within the second opening, whereby the electronic component and the bonding wires can be completely sealed when the opening are filled with a resin.

In the step of mounting electronic component on the surface of the supporting layer within the first opening, the electronic component may be bonded to the supporting layer by way of an adhesive film. Moreover, a copper foil may be used as the supporting layer.

The electronic component is mounted on the supporting layer formed from copper foil. The copper foil is removed by etching after the first and second openings have been filled with a resin; and the insulating resin layer is formed on both surfaces after removal of the copper foil. In this case, when the copper foil is removed by etching, there is left only the copper foil located at a position where the electronic component is mounted. When the insulating resin layer is formed on both surfaces of the substrate from which the copper foil has been partially removed, an opening is formed in the insulating resin layer in such a way that the remaining copper foil becomes partially exposed, to thus constitute a heat radiation section.

Two stacked semiconductor chips may be used as the electronic component, electrode terminals formed on an upper surface of an upper semiconductor chip may be electrically connected to the connection conductor sections by means of bonding wires, connection terminals formed on a lower surface of a lower semiconductor chip may be bonded to the copper foil, and the copper foil may be subsequently patterned, to thus form a wiring pattern to be connected to the connection terminals of the lower semiconductor chip.

DETAILED DESCRIPTION

Embodiments of the present invention will be described in detail herein below by reference to the accompanying drawings.

FIGS. 1 through 12 show a method for manufacturing a multilayer wiring substrate mounted with electronic components according to a first embodiment of the present invention.

Figures 1, 2:
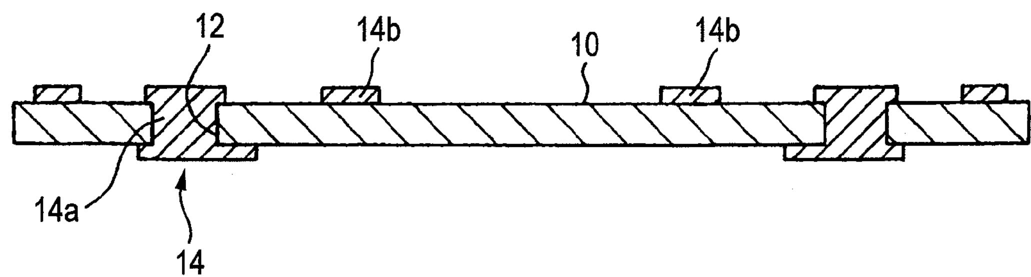
FIG. 1 shows a core material of a first embodiment in which a wiring pattern is formed.
FIG. 2 shows a state where the core material has been subjected to frame cutting.

FIG. 1 shows a core material in which a wiring pattern is formed. A plate-like core material 10, which is formed from a glass epoxy material, or the like, and which is usually used as a material of a wiring substrate, is prepared, and through holes 12 are formed in the core material 10 by means of a well-known appropriate method. The core material 10 including the through holes 12 is plated with copper, or the like. A copper plating layer is patterned by means of a subtractive process, thereby forming a required wiring pattern 14 including conductor vias **14*a* which penetrates through the through holes 12. A plurality of connection pads 14*b*, which are to serve as connection conductor sections to be connected to electronic components to be mounted by means of wire bonding in a subsequent process, are also formed simultaneously as a part of the wiring pattern 14**.

Alternatively, a double-sided copper clad plate, which is formed by previously forming a copper layer on either side of the core material 10, may also be used. After formation of through holes, the through holes may be plated. The wiring pattern 14 including the conductor vias **14*a* and the connection pads 14*b*** may also be formed by means of patterning.

FIG. 2 shows a state where the core material has been subjected to frame-cutting. As illustrated, openings 16 which penetrate through the core material 10 are formed in the plate-like core material 10 by means of frame-cutting operation. Such openings 16 can be formed in the core material 10 by use of; for example, a rooter, a drill, or a punch die. A plurality of connection pads 14*b* for use in wire bonding are arranged in surrounding areas of the respective openings 16 on the upper surface of the core material 10.

Figure 3:
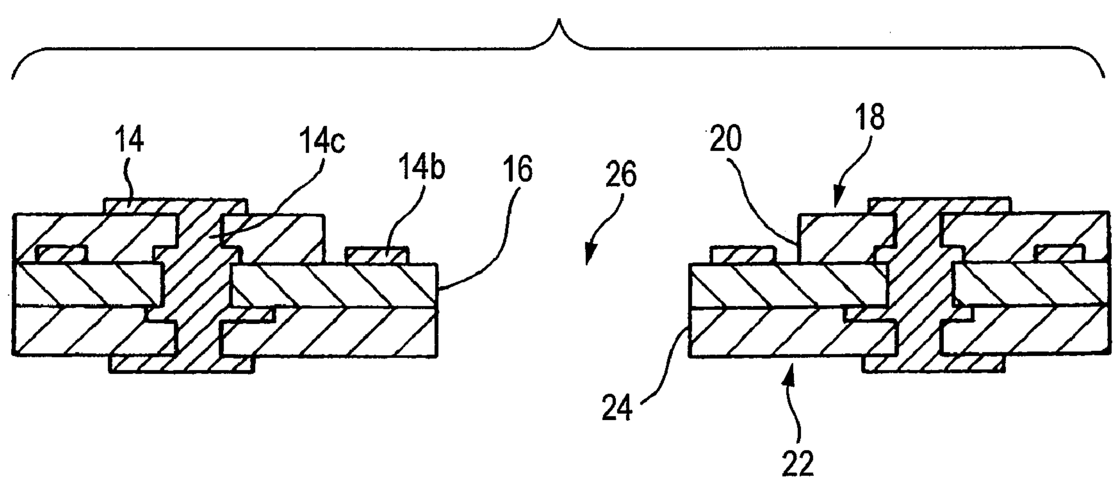
FIG. 3 shows a state where a resin layer is formed on upper and lower surfaces of the core material.

FIG. 3 shows a state where a resin layer is formed on the upper and lower surfaces of the core material. An insulating resin layer 18 formed from a prepreg is provided on the upper surface of the core material 10. Likewise, an insulating resin layer 22 formed from a prepreg is formed over the lower surface of the core material 10. Openings 20, which are larger than the openings 16 of the core material 10, are previously formed in the insulating resin layer 18 on the upper surface of the core material 10. Likewise, openings 24 which are identical in size and shape with the openings 16 are previously formed in the insulating resin layer 22 on the lower surface of the core material 10. These openings 20 and 24 can also be formed in a prepreg resin by means of a rooter, a drill, or a punch die.

When the insulating resin layers 18 and 22 are stacked on both surfaces, the openings 20 of the insulating resin layer 18 and the openings 24 of the insulating resin layer 22 are aligned to the openings 16 of the core material 10. As a result, the connection pads 14*b* which are to serve as connection conductors for use in wire bonding become exposed in the respective openings 20 of the insulating resin layer 18 on the upper surface of the core material 10. In the meantime, the openings 24 of the insulating resin layer 22 on the lower surface of the core material 10 and the openings 16 of the core material 10 are identical in shape and size to each other, and hence the openings are aligned, to thus create common openings 26.

Via holes are formed in the insulating resin layers 18 and 22 provided on both surfaces of the core material 10 by means of via processing using a laser beam. The wiring pattern 14, including via conductors, is formed in a stacked manner by means of application of a resist (not shown), patterning of the resist, and copper plating, according to a well-known method, such as a semi-additive method.

Figure 4:
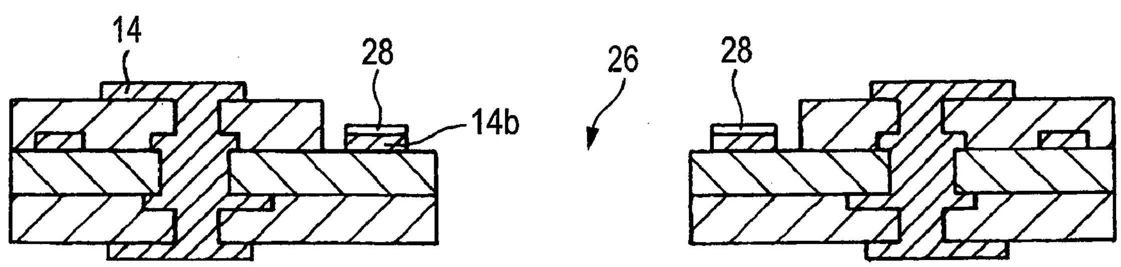
FIG. 4 shows a state where a connection pad is plated with nickel and gold.

FIG. 4 shows a view of the connection pads 14*b* plated with nickel and gold. The connection pads 14*b* are areas to be electrically connected in a subsequent process by means of wire bonding. It is preferable to form a nickel-gold plating layer 28 on each of the connection pads 14*b*, especially if the gold wire is used in the subsequent process. The nickel-gold plating layer 28 is formed by means of application a resist (not shown) and patterning of the resist, and nickel plating and gold plating for openings in the resist pattern located above the respective connection pads 14*b*.

Figure 5:
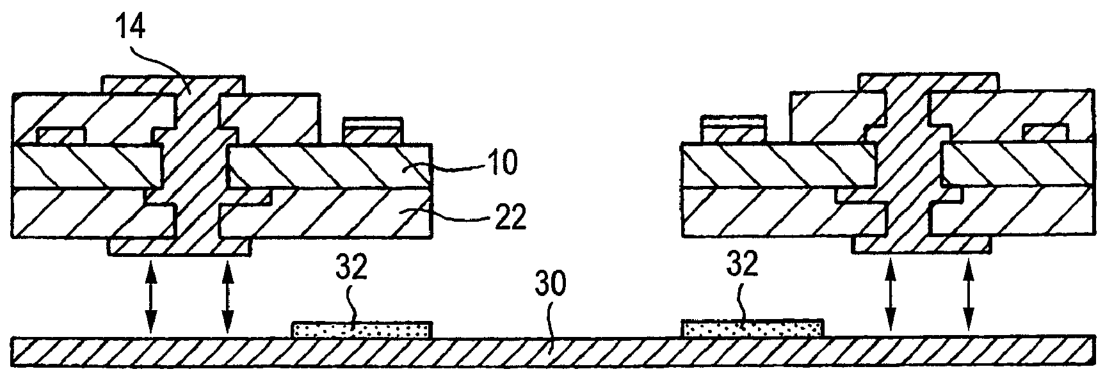
FIG. 5 shows a state where a substrate is bonded to copper foil.

FIG. 5 shows a process status in which copper foil is bonded to the insulating resin layer 22 of the substrate. First, copper foil 30 of appropriate width and thickness is prepared, and insulating resist ink 32 acting as a bonding material is printed on a bonding surface side of the copper foil 30. This copper foil 30 is crimp-bonded to the lower side of the substrate; namely, to a surface of the insulating resin layer 22 opposing to the surface bonded to the core material 10. This copper foil 30 is to serve as a supporting member in the next process when electronic components 34, such as silicon devices or integrated circuits, are mounted.

Figure 6:
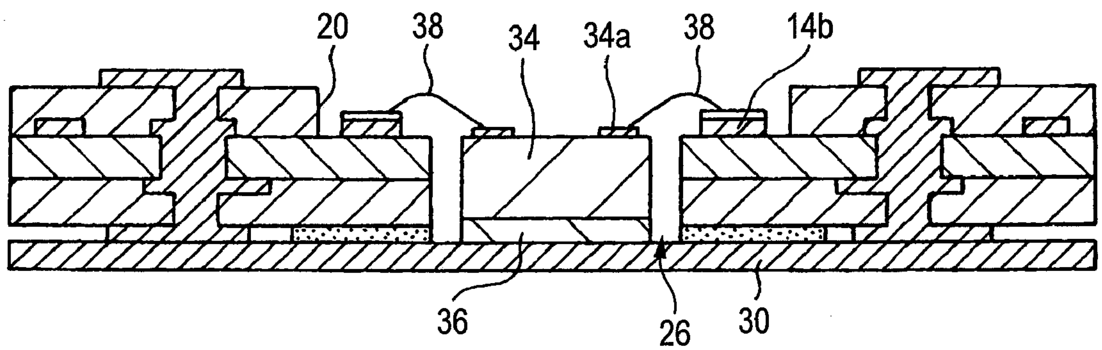
FIG. 6 shows a state where an electronic component is mounted and wire-bonded.

FIG. 6 is a view showing a state where electronic components 34 are mounted and where wire bonding has been practiced. The electronic components 34 are housed in the respective common openings 26 formed from the openings 16 of the core material 10 and the openings 24 of the insulating resin layer 22, and are mounted on the copper foil 30 exposed by means of the openings 26. When the electronic components 34 are mounted, a die attach film 36 serving as an adhesive material is previously affixed to a circuit-unformed plane of each electronic component 34; namely, a lower surface of each electronic component 34, and the electronic components 34 are fixed to the copper foil 30. Alternatively, the electronic components 34 can also be fixed to the copper foil 30 by means of; e.g., a surface mount method involving face-down mounting of silicon, without use of an adhesive material, such as a die attach film 36.

Next, a plurality of electrode terminals 34*a* formed on the surface of each electronic component 34 and the plurality of connection pads 14*b* coated with the nickel-gold plating layer 28 are electrically connected by means of bonding wires 38. Since the bonding wires 38 assume a looped shape, adjustment must be performed in such a way that the highest position of the loop falls within the range of the opening 20 of the insulating resin layer 18; namely, the loop does not project upwardly from the upper surface of the insulating resin layer 18. Put another way, the insulating resin layer 18 which is on the upper side of the core material and which is formed from a prepreg must have a thickness required to absorb the loops of the bonding wires 38. Gold (Au), copper (Cu), or aluminum (Al) can be appropriately used as the bonding wires 38.

Figure 7:
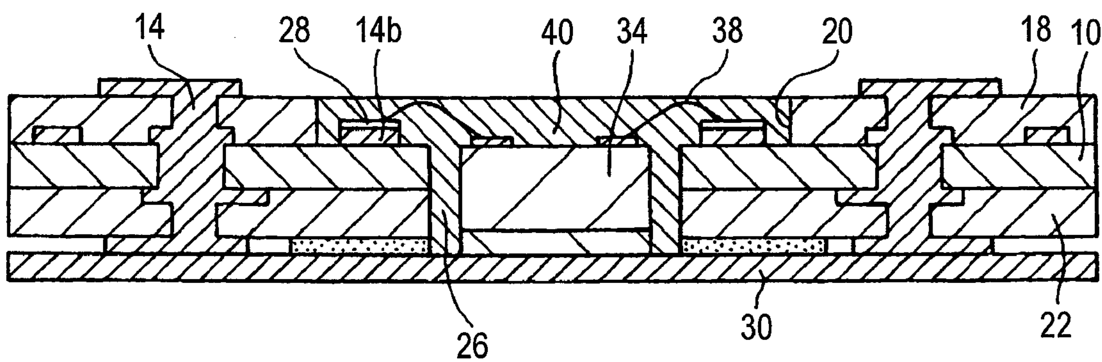
FIG. 7 shows a state where sealing resin is filled.

FIG. 7 shows a state where the electronic components 34 are sealed with a resin. The common openings 26, each of which consists of the opening 16 of the core material 10 and the opening 24 of the insulating resin layer 22, and the opening 20 of the insulating resin layer 18 including a wire bonding area located above the opening 26 are filled with a sealing resin 40. As a result, the electronic components 34 and the bonding wires 38 are sealed in an insulated manner. A molding resin, a potting resin, an underfill resin, and the like, can be used as the sealing resin 40.

Figure 8:
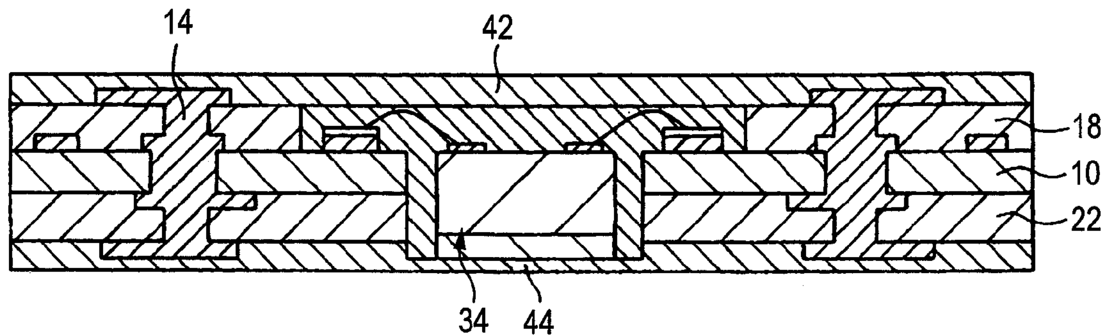
FIG. 8 shows a state where the copper foil is removed and where an insulating resin is formed on both surfaces of the substrate.

FIG. 8 shows a state where the copper foil serving as a supporting layer is removed and where an insulating resin layer is provided on both surfaces of the substrate. The copper foil 30 serving as a supporting layer is exfoliated and removed by use of; for example, an appropriate etchant which dissolves copper. After both surfaces of the substrate have been roughened by means of ashing, insulating resin layers 42 and 44 formed from a material analogous to that of the insulating resin layer 18 and 22; namely, a prepreg, are formed on both surfaces of the substrate. Thus, as a result of removal of the copper foil 30, both surfaces of the substrate are covered with the insulating resin which is a homogeneous material, so that warpage of the substrate attributable to a difference between coefficients of thermal expansion can be diminished.

Figure 9:
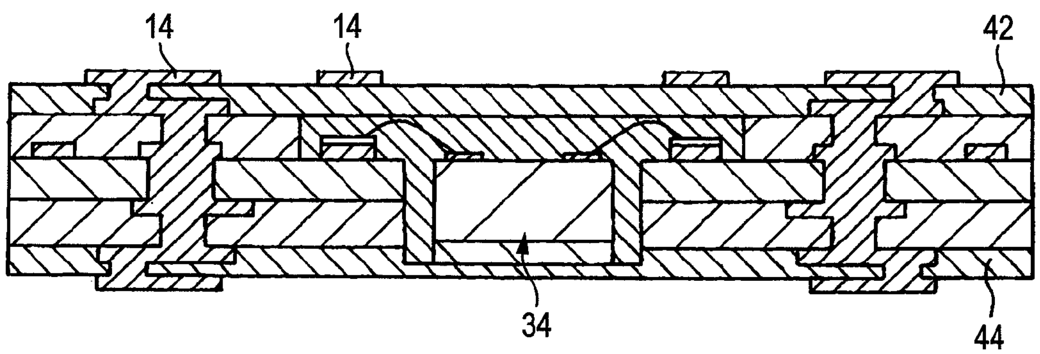
FIG. 9 shows a state where a wiring pattern is formed on the insulating resin on both surfaces of the substrate.

FIG. 9 shows a state where a wiring is formed in the insulating resin layers on both surfaces of the substrate. Via holes are formed in the insulating resin layers 42 and 44 formed on both surfaces of the substrate by means of via processing using a laser beam. The wiring pattern 14, including the via conductor sections, is formed in a stacked manner by means of application of a resist (not shown), patterning of the resist, and copper plating.

Figure 10:
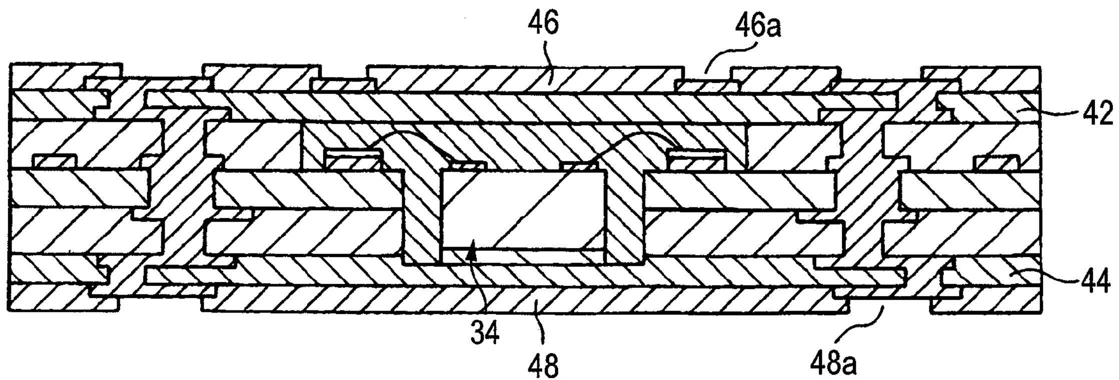
FIG. 10 shows a state where a resist is patterned.

FIG. 10 is a view showing a state where the resist has been patterned. A resist 46 is applied over the insulating resin layer 42 on one surface of the substrate where the wiring pattern 14 is formed, and a resist 48 is applied over the insulating resin layer 44 on the other surface of the substrate where the wiring pattern 14 is formed. These layers of resist are patterned. Portions of the wiring pattern exposed through the patterned-openings of the resist layers 46 and 48 constitute; for example, connection pads 46*a* for use in mounting a surface mount component in the next process. Alternatively, the exposed portions are used as connection pads 48*a* used for connection with external connection terminals, such as solder bumps.

Figure 11:
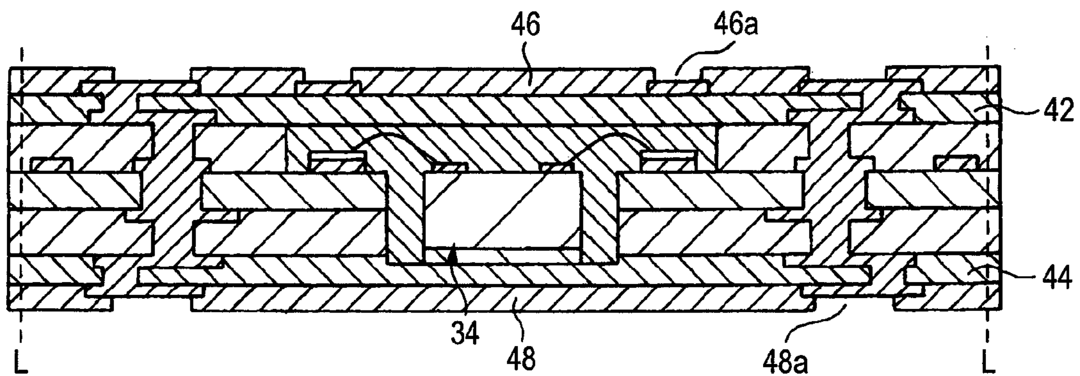
FIG. 11 shows a state where dicing is performed.

FIG. 11 shows a state where dicing is performed. An illustrated area corresponds to an area in the substrate which includes at least one electronic component 34. The substrate is sliced by means of dicing along a plane L in units constituting a single semiconductor device.

Figure 12:
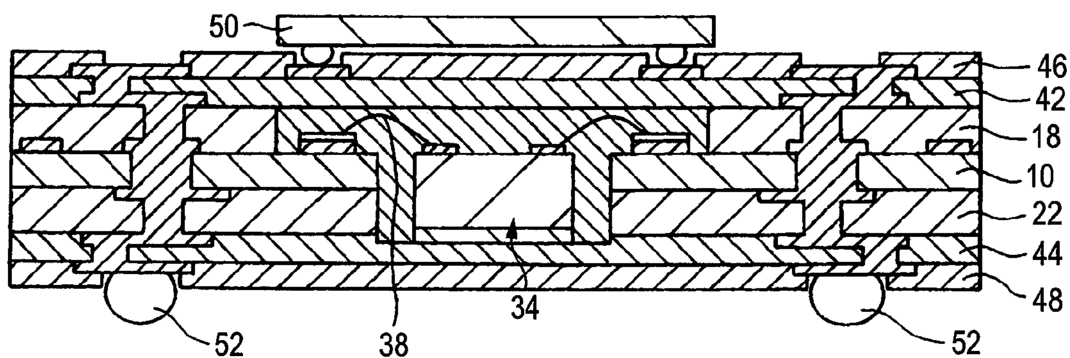
FIG. 12 shows a state where a multilayer wiring substrate of the first embodiment is completed.

FIG. 12 shows a state where a surface mount component is mounted and where external connection terminals are formed. In the multilayer wiring substrate mounted with an electronic component sliced as one semiconductor device unit, a surface mount component 50 is mounted by way of the connection pads 46*a* and by means of a surface mount technique (SMT), or solder bumps 52 are formed on the connection pads 48*a* used for connection with external connection terminals.

In the multilayer wiring substrate mounted with an electronic component of the first embodiment of the present invention, even when the electronic components 34 and the connection pads 14*b* of the substrate are electrically connected together by use of wire bonding in a structure that the frame-cut core material 10; namely, the core material having the openings 16, and the insulating resin layer 22 which have the openings 24 and which is formed from a prepreg is used, the electronic components 34, such as integrated circuits, are accommodated in the respective openings 26 common for the core material 10 and the insulating rein layer 22, and the bonding wires 38 are accommodated in the respective openings 20 of the insulating resin layer 18. Accordingly, when compared with the case of the related-art multilayer wiring substrate mounted with an electronic component in which electronic components are mounted on the upper surface of the substrate and connected through wire bonding, the thickness of the multilayer wiring substrate mounted with the electronic components 34 can be reduced remarkably.

Since the core material 10 and the insulating resin layer 22 are stacked in a frame-cutting manner, filling of the sealing resin 40 can be performed by utilization of the electronic components 34 and the frame-cut openings 20 and 26 of the wire bonding section. The openings 20 and 26 act as a frame at the time of filling of the sealing resin 40, whereby flow of a fused resin can be prevented by means of an effect of a dam.

FIGS. 13 through 17 sequentially show a method for manufacturing a multilayer wiring substrate mounted with electronic components of a second embodiment of the present invention. Since the second embodiment is the same as the first embodiment from the process (FIG. 1) for preparing the core material 10 shown in FIGS. 1 through 7 and forming a wiring pattern until the process (FIG. 7) for filling a sealing resin, their repeated explanations are omitted.

Figure 13:
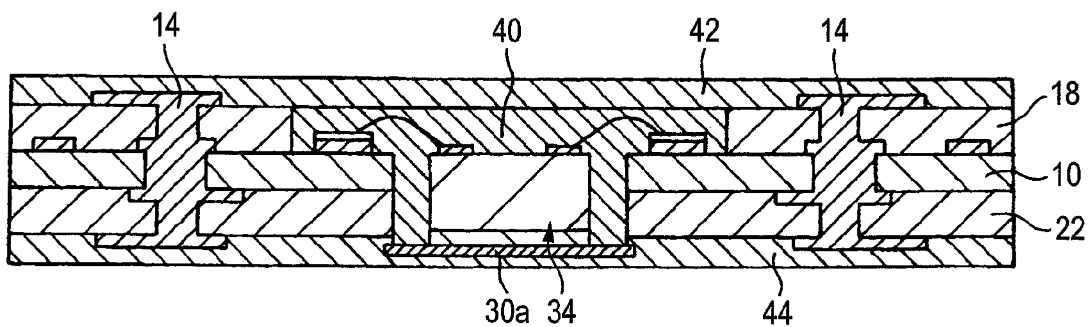
FIG. 13 shows a state of a second embodiment where an insulating resin is formed on both surfaces of a substrate from which the copper foil has been partially removed.

FIG. 13 shows a state where the copper foil 30 is exfoliated and removed and then the insulating resin layer is formed on both surfaces of the core material. The electronic components 34 are mounted on the substrate (FIG. 6), and the openings 26 and the 20 are filled with the sealing resin 40, to thus seal the electronic components 34 and the bonding wires 38 in an insulated manner (FIG. 7). Subsequently, in the second embodiment, the copper foil 30 acting as a supporting layer in FIG. 13 when the electronic components 34 are mounted is dissolved and removed by use of an etchant which dissolves; for example, copper. However, a range over which the copper foil 30 is dissolved is partially limited, and only a portion of the copper foil 30 is left in only the areas corresponding to the lower surfaces where the electronic components 34 are mounted. Specifically, when the copper foil 30 is dissolved and removed from the back surface by use of an etchant, a treatment is temporarily suspended in midstream during the course of a progress in etching, and only the areas of the lower surface corresponding to the electronic components 34 are covered with an appropriate mask, thereby causing etching of only the other area to proceed. Thus, the copper foil is completely removed, to thus leave the copper foil 30*a* partially in only the areas of the lower surface corresponding to the electronic components 34. In order to make heat radiation characteristics of the electronic components more appropriate, a heat-radiation sheet may also be interposed between the electronic components 34 and the copper foil 30 when the electronic components 34 are mounted on the copper foil 30 serving as a supporting layer.

As in the case of the first embodiment, after the resin on both surfaces of the substrate has been roughened by means of ashing, insulating resin layers 42 and 44, which are formed from a material analogous to that of the insulating resin layers 18 and 20, are formed on both surfaces of the substrate. As mentioned above, the majority of the copper foil 30 is removed, and both surfaces of the substrate are covered with the insulating resin layers 42 and 44 that are formed from a homogeneous material, whereby the chance of occurrence of warpage in the substrate attributable to a difference in coefficient of thermal expansion can be reduced.

Figure 14:
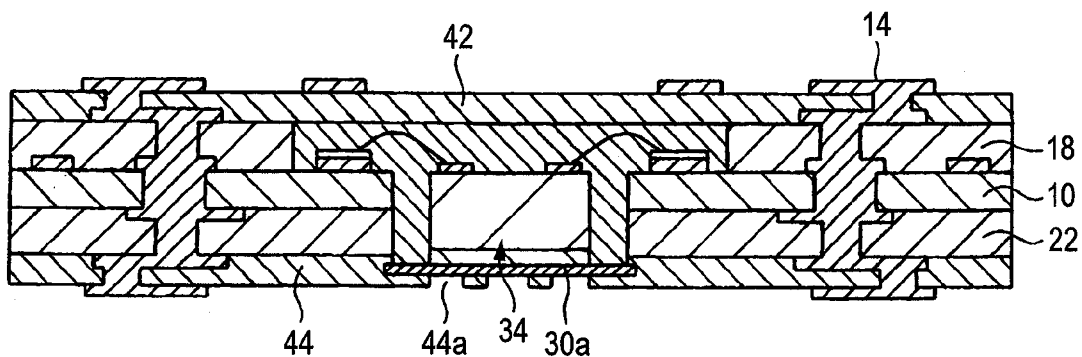
FIG. 14 shows a state where the wiring pattern is formed on the insulating resin on both surfaces of the substrate.

FIG. 14 shows a state where wiring is formed in the insulating resin layers provided on both surfaces of the substrate. As in the case of the first embodiment, via holes are formed in the insulating resin layers 42 and 44 formed on both surfaces of the substrate, by means of via processing through use of a laser beam, or the like. However, concurrently with via processing, holes or grooves 44*a* are formed in areas of the insulating resin layer 44 covering the copper foil 30*a* left on the lower surface of the electronic components 34, thereby partially exposing the copper foil 30*a*. Thus, the remaining copper foil 30*a* can act as heat radiation sections for the electronic components 34.

As in the case of the first embodiment, after via processing, the wiring pattern 14 including via conductor sections is formed so as to be stacked further by means of application of a resist (not shown), patterning of the resist, and copper plating.

Figure 15:
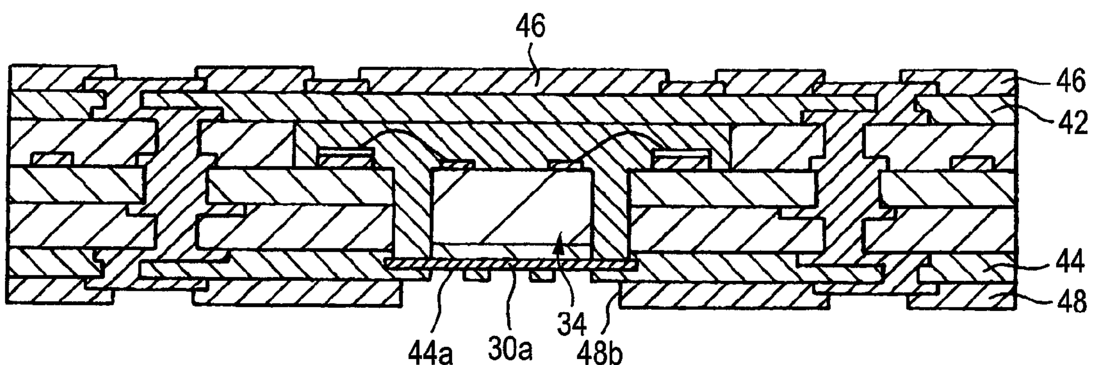
FIG. 15 shows a state where resist is patterned.

FIG. 15 is a view showing the state where the resist is patterned. As in the case of the first embodiment, the resist layers 46 and 48 are applied over the respective insulating resin layers 42 and 44 on both surfaces of the substrate where the wiring pattern is formed, and these layers of resist are patterned. In this case, an area of the resist 48 corresponding to the copper foil 30*a* on the lower surface of the electronic component 34 serves as an opening 48*b* in order to make superior the heat radiation characteristic of the electronic component 34 realized by the copper foil 30*a*. Portions of the wiring pattern exposed through other pattern openings of the resist 46 are formed as; for example, connection pads 46*a* used for mounting surface mount components in the next process. Alternatively, portions of the wiring pattern exposed through other pattern openings of the resist 48 are used as; for example, connection pads 48*a* used for connecting external connection terminals of solder bumps, and the like.

Figure 16:
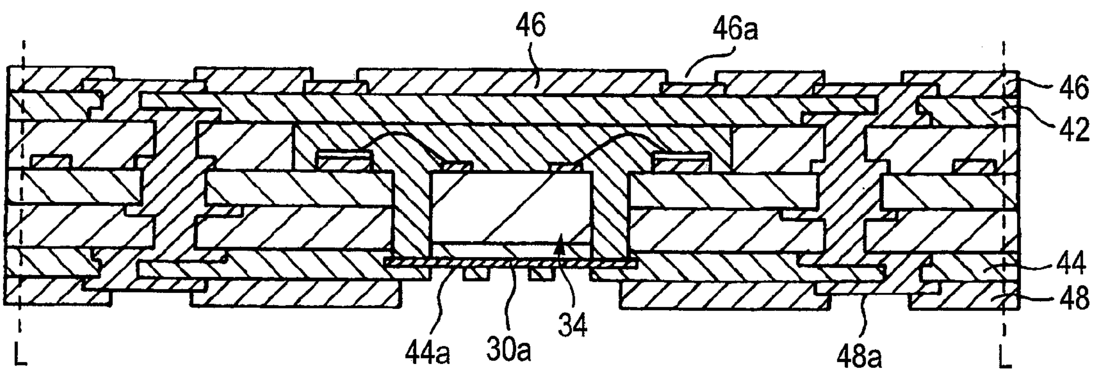
FIG. 16 shows a state where dicing is performed.

FIG. 16 shows a state where dicing is performed. As in the case of the first embodiment, an illustrated area corresponds to an area in the substrate which includes at least one electronic component 34. The substrate is sliced by means of dicing along the plane L in units constituting a single semiconductor device.

Figure 17:
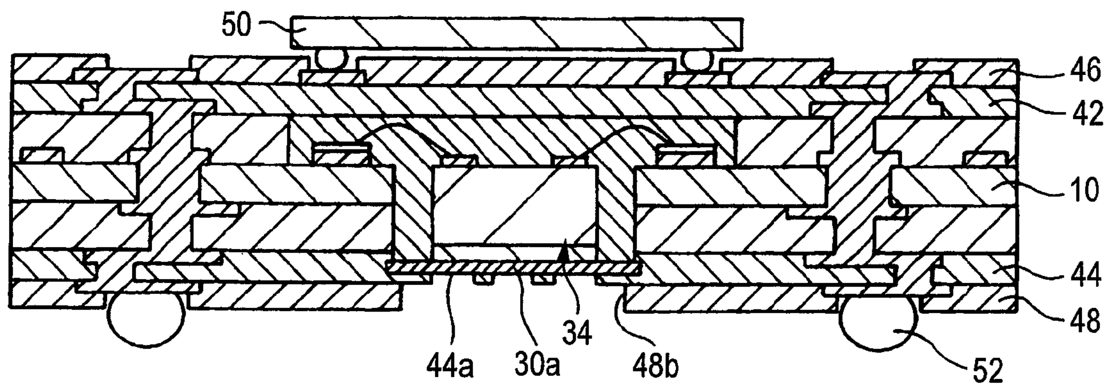
FIG. 17 shows a state where a multilayer wiring substrate of the second embodiment is completed.

FIG. 17 shows a state where a surface mount component is mounted and where external connection terminals are formed. As in the case of the first embodiment, in a multilayer wiring substrate mounted with an electronic component sliced as one semiconductor device unit, a surface mount component 50 is mounted by way of the connection pads 46*a* and by means of a surface mount technique (SMT), or the solder bumps 52 are formed on the connection pads 48*a* used for connection with external connection terminals.

As in the case of the first embodiment, in the multilayer wiring substrate mounted with an electronic component of the second embodiment of the present invention, even when the electronic components 34 and the connection pads 14*b* of the substrate are electrically connected together by use of wire bonding in a structure that the frame-cut core material 10; namely, the core material having the openings 16, or the insulating resin layer 22 which have the openings 24 and which is formed from a prepreg is used, the electronic components 34, such as integrated circuits, are accommodated in the respective openings 26 common for the core material 10 and the insulating rein layer 22, and the bonding wires 38 are accommodated in the respective openings 20 of the insulating resin layer 18. Accordingly, when compared with the case of the related-art multilayer wiring substrate mounted with an electronic component in which electronic components are mounted on the upper surface of the substrate and connected through wire bonding, the thickness of the multilayer wiring substrate mounted with the electronic components 34 can be reduced remarkably.

In the multilayer wiring substrate mounted with an electronic component manufactured by means of the manufacturing method of the second embodiment of the present invention, the copper foil 30 exhibiting high thermal conductivity is partially left on the respective lower surfaces of the electronic components 34. The holes or grooves 44*a* are formed in the areas of the insulating resin layer 44 corresponding to the areas of the copper foil 30, whereby the copper foil 30 becomes partially exposed. As a result, the copper foil 30 acts as a heat radiation section for the electronic components 34, so that the multilayer wiring substrate mounted with an electronic component exhibiting a superior heat radiation characteristic can be acquired.

FIGS. 18 through 23 show, in the sequence of processes, a method for manufacturing a multilayer wiring substrate mounted with electronic components of a third embodiment of the present invention. Since the third embodiment is the same as the first embodiment from the process (FIG. 1) for preparing the core material 10 shown in FIGS. 1 through 5 and forming a wiring pattern until the process (FIG. 5) for crimping copper foil serving as a supporting layer to the substrate, their repeated explanations are omitted.

Figure 18:
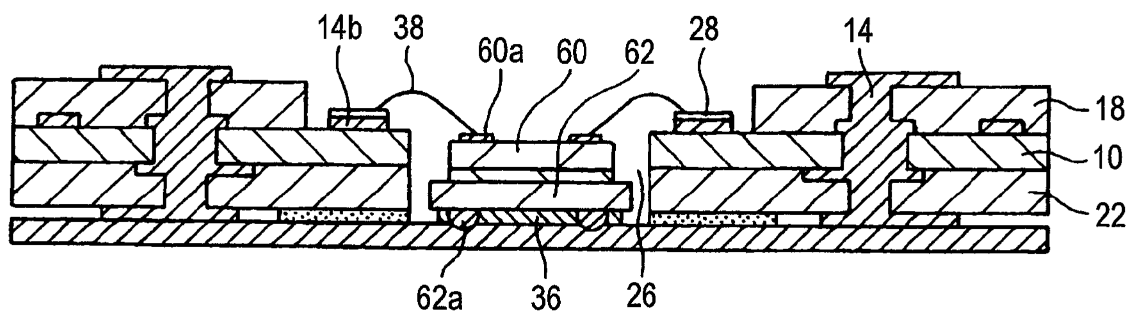
FIG. 18 shows a state of a third embodiment in which two electronic components are mounted and wire-bonded.

FIG. 18 is a view showing a state where two stacked electronic components (semiconductor chips) 60 and 62 are mounted on a substrate and where the upper electronic component 60 has been subjected to wire bonding. As in the case of the electronic component used in the previous embodiments, electrode terminals 60*a* are provided on the upper surface of the upper electronic component 60 of the two electronic components 60 and 62, and the electrode terminals 60*a* are connected through wire bonding. When compared with the electronic components used in the previously-described embodiments, the electronic components must have a smaller thickness.

The other electronic component 62 provided at a lower position is of a surface mount type, and connection terminals 62*a* formed from a bump are provided on the lower surface of the electronic component 62. The electronic components 60 and 62 of such a stack type must be of thickness so as to fall, in a stacked state, within the depth of the common opening 26 formed in the core material 10 and the insulating resin layer 22. Various devices are available as the two electronic components 60 and 62 of stack type. However, the devices are mounted, while having been fixed together in advance, on the substrate.

The lower surface of the lower electronic component 62 and the copper foil 30 are crimped together by bonding a die attach film 36, which serves as an adhesive, to the lower surface of the electronic component 62 and then bonding the electronic component 62 to the copper foil 30 by means of heating and pressurization. The connection terminals 62*a* of the electronic components 62 and the copper foil 30 are electrically connected together by means of pressure welding.

The plurality of electrode terminals 60*a* formed on the surface of the upper electronic component 60 and the plurality of connection pads 14*b* covered with the nickel-gold plating layer 28 are electrically connected together by means of the bonding wires 38. Since the bonding wires 38 assume a looped shape, adjustment must be performed in such a way that the highest positions of the loops falls within the range of the opening 20 of the insulating resin layer 18; namely, the loop does not project upwardly from the upper surface of the insulating resin layer 18, as in the case of the previously-described embodiments. Put another way, the insulating resin layer 18 formed from a prepreg must have a thickness required to absorb the loops of the bonding wires 38. Gold (Au), copper (Cu), or aluminum (Al) can be appropriately used as the bonding wires 38.

When the electronic components (semiconductor chips) 60 and 62 of stack type are mounted on the copper foil 30, the two electronic components 60 and 62 may also be mounted by one operation after having been bonded together as mentioned previously. Alternatively, the lower electronic component 62 may also be mounted first, and the connection terminals 62*a* may be connected to the copper foil. Subsequently, the upper electronic component 60 may be mounted on the lower electronic component 62, and the upper electronic component 60 may then be subjected to wire bonding.

Figure 19:
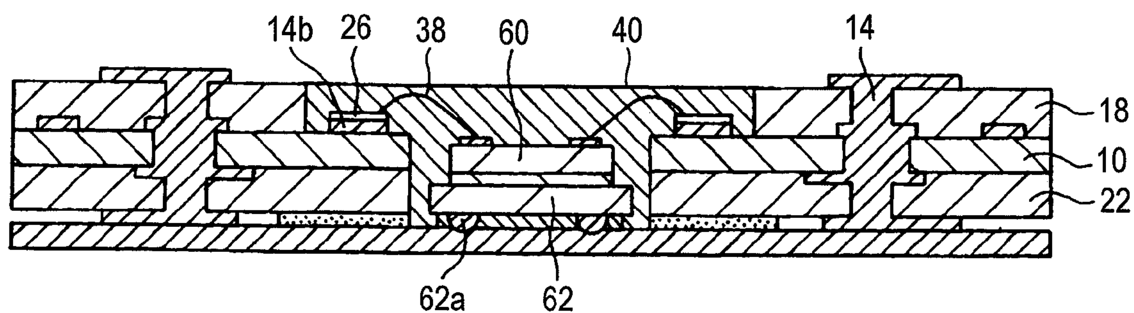
FIG. 19 shows a state where sealing resin is filled.

FIG. 19 shows a state where the electronic components are sealed with a resin. The common openings 26 and the opening 20 of the insulating resin layer 18 including a wire bonding area located above the opening 26 are filled with a sealing resin 40. As a result, the electronic components 60, 62 and the bonding wires 38 are sealed in an insulated manner. A molding resin, a potting resin, an underfill resin, and the like, can be used as the sealing resin 40.

Figure 20:
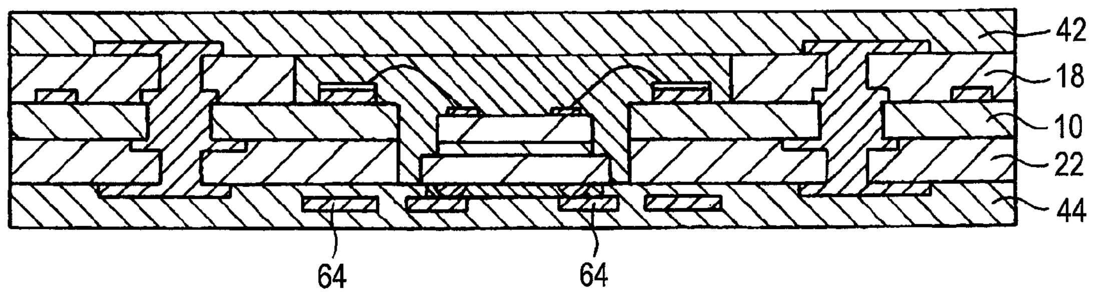
FIG. 20 shows a state where copper foil is removed and where a wiring pattern is formed on the insulating resin on both surfaces of the substrate.

FIG. 20 shows a state where copper foil serving as a supporting layer is removed and where an insulating resin layer is provided on both surfaces of the substrate. The copper foil 30 that has served as a supporting layer when the two electronic components 60 and 62 are mounted is exfoliated and removed by use of; for example, an appropriate etchant which dissolves copper. However, a range over which the copper foil 30 is dissolved is partially limited, thereby forming a wiring pattern 64 to be connected to the connection terminals 62*a* of the lower electronic component 62. Specifically, when the copper foil 30 is dissolved and removed from the back surface by use of an etchant, a treatment is temporarily suspended in midstream during the course of a progress in etching, and only the areas of the lower surface corresponding to the wiring pattern 64 to be connected to the connection terminals 62*a* of the electronic component 62 are covered with an appropriate mask, thereby causing etching of only the other area to proceed. Thus, the copper foil is completely removed, to thus leave the wiring pattern 64.

As in the case of the pervious embodiments, after the resin on both surfaces of the substrate has been roughened by means of ashing, insulating resin layers 42 and 44, which are formed from a material analogous to that of the insulating resin layers 18 and 22, are formed on both surfaces of the substrate. As mentioned above, the majority of the copper foil 30 is removed, and both surfaces of the substrate are covered with the insulating resin layers that are formed from a homogeneous material, whereby the chance of occurrence of warpage in the substrate attributable to a difference in coefficient of thermal expansion can be reduced.

Figure 21:
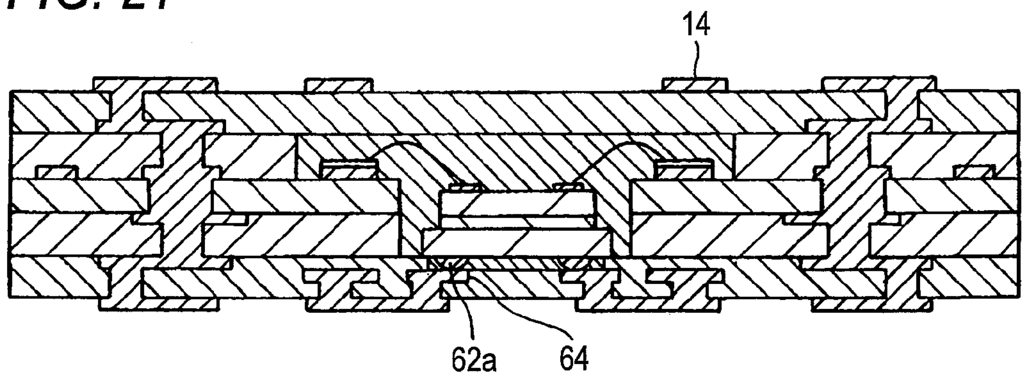
FIG. 21 shows a state where a wiring pattern is formed in the insulating resin on both surfaces of the substrate.

FIG. 21 shows a state where wiring is formed in the insulating resin layers provided on both surfaces or the substrate. As in the case of the previous embodiments, via holes are formed in the insulating resin layers 42 and 44 formed on both surfaces of the substrate, by means of via processing through use of a laser beam, or the like. However, during via processing, via holes, which are used for creating conductor vias connected to a wiring pattern 64 to be connected to connection terminals 62*a* or the electronic component 62, are also formed concurrently.

As in the case of the previous embodiments, after via processing, the wiring pattern 14 including via conductor sections is formed so as to be stacked further by means of application of a resist (not shown), patterning of the resist, and copper plating.

Figure 22:
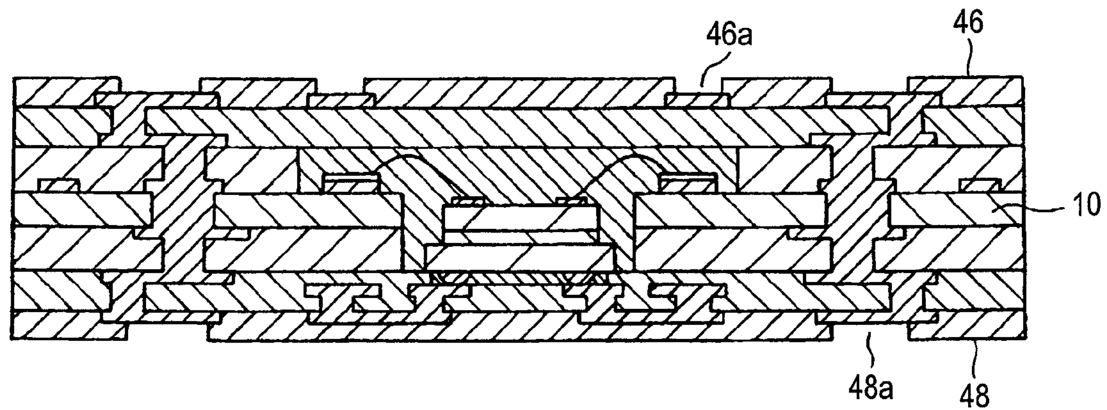
FIG. 22 shows a state where the resist has been patterned.

FIG. 22 is a view showing the state where the resist is patterned. As in the case of the previous embodiment, the resist layers 46 and 48 are applied over the respective insulating resin layers 42 and 44 on both surfaces of the substrate where the wiring pattern is formed. The resist layers are patterned. Portions of the wiring pattern exposed through other pattern openings of the resist 46 are formed as; for example, connection pads 46*a* used for mounting surface mount components in the next process. Alternatively, portions of the wiring pattern exposed through other pattern openings of the resist 48 are used as; for example, connection pads 48*a* used for connecting external connection terminals of solder bumps, and the like.

Figure 23:
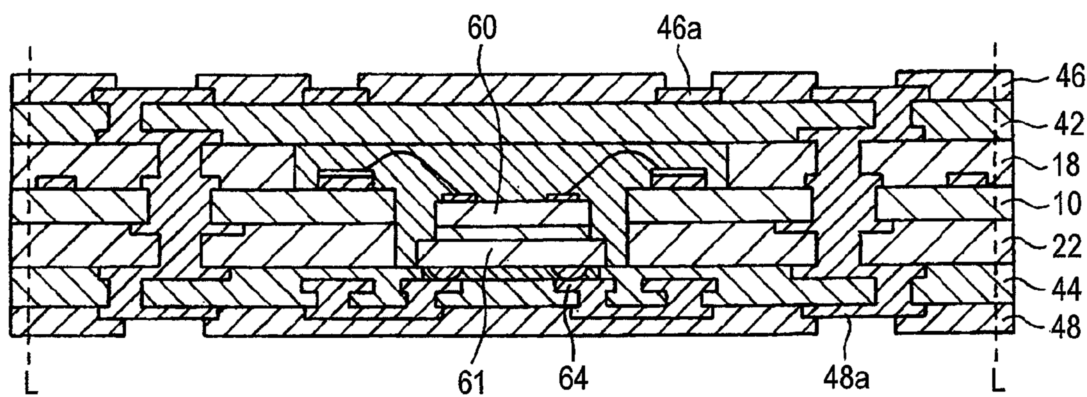
FIG. 23 shows a state where dicing is performed.

FIG. 23 shows a state where dicing is performed. An illustrated area corresponds to an area in the substrate which includes at least one electronic component 34. The substrate is sliced by means of dicing along the plane L in units constituting a single semiconductor device.

Figure 24:
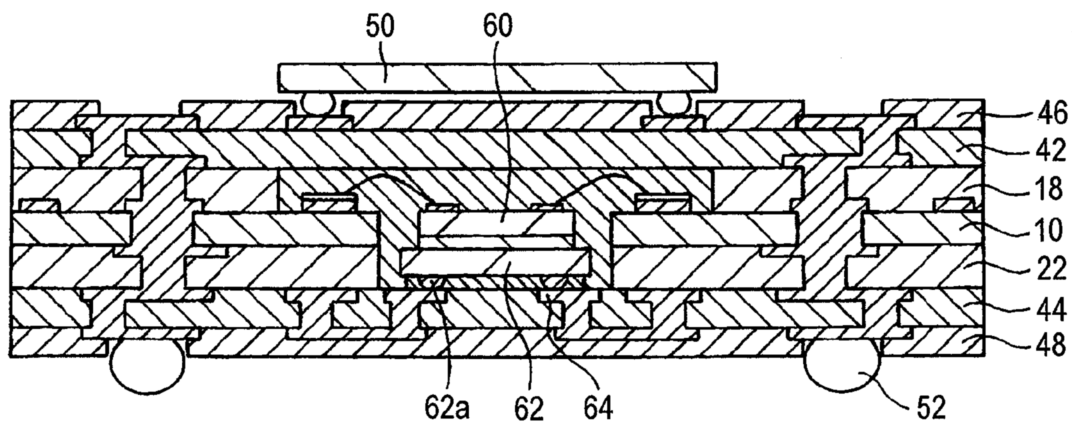
FIG. 24 shows a state where a multilayer wiring substrate of the third embodiment has been completed.

FIG. 24 shows a state where a surface mount component is mounted and where external connection terminals are formed. As in the case of the previous embodiments, in a multilayer wiring substrate mounted with an electronic component of the third embodiment sliced as one semiconductor device unit, a surface mount component 50 is mounted by way of the connection pads 46*a* and by means of a surface mount technique (SMT), or the solder bumps 52 are formed on the connection pads 48*a* used for connection with external connection terminals.

In addition to yielding the same working-effect as that yielded in the first and second embodiments, the multilayer wiring substrate mounted with an electronic component of the third embodiment of the present invention enables mounting of, on a multilayer wiring substrate, an electronic component of wire bonding type and an electronic component of stack type, such as a surface mount electronic component, which differ from each other in terms of a connection type.

Although the embodiments of the present invention have been described by reference to the accompanying drawings, the present invention is not limited to those embodiments and can be embodied in various forms or is susceptible to alterations or modifications within the spirit and scope of the present invention.

As has been described above, according to the present invention, an electronic component, such as an integrated circuit, is accommodated in an opening of a core material layer, and the electronic component and connection conductor sections are electrically connected together by means of wire bonding and by utilization of openings of a prepreg resin layer. When compared with the case of the related-art multilayer wiring substrate mounted with an electronic component in which the electronic components are mounted directly on the upper surfaced of a substrate and connected by means of wire bonding, the thickness of the multilayer wiring substrate having mounted electronic components can be reduced remarkably. The thin multilayer wiring substrate mounted with electronic components can be obtained.

Since the core material and the prepreg resin layer are subjected to frame-cut stacking, sealing resin can be filled by utilization of frame-cut openings of the electronic component and the wire bonding section, thereby preventing outflow of the sealing resin. Namely, an effect of a dam can be exhibited.

What is claimed is:

1. A method for manufacturing a multilayer wiring substrate mounted with an electronic component, comprising:

preparing a plate-like core material layer having a wiring and a first opening, the wiring including a plurality of connection conductor sections formed around the first opening on one surface of the core material layer;

forming, on the one surface of the core material layer, a resin layer having a second opening which is greater than the first opening in such a way that the plurality of connection conductor sections are exposed within the second opening;

forming a second resin layer having a third opening which is the same size as the first opening on the other surface of the core material layer in such a way that the third opening is aligned to the first opening;

bonding a supporting layer to the second resin layer;

mounting the electronic component on a surface of the supporting layer within the first and third openings;

electrically connecting the electronic component to the plurality of connection conductor sections by means of bonding wires; and filling the first, second, and third openings with a resin in order to seal the electronic component and the bonding wires.

2. The method for manufacturing a multilayer wiring substrate mounted with an electronic component according to claim 1, wherein, in the step of electrically connecting the electronic component to the plurality of connection conductor sections by means of bonding wires, the electronic component is connected in such a way that topmost ends of respective loops of the bonding wires are situated below an upper surface of the second opening.

3. The method for manufacturing a multilayer wiring substrate mounted with an electronic component according to claim 1, wherein, in the step of mounting the electronic component on the surface of the supporting layer within the first and third opening, the electronic component is bonded to the supporting layer by way of an adhesive film.

4. The method for manufacturing a multilayer wiring substrate mounted with an electronic component according to claim 1, wherein a copper foil is used as the supporting layer.

5. The method for manufacturing a multilayer wiring substrate mounted with an electronic component according to claim 4, further comprising steps of:

removing the copper foil; and forming an insulating resin layer on both surfaces of the substrate after removal of the copper foil.

6. The method for manufacturing a multilayer wiring substrate mounted with an electronic component according to claim 5, wherein, in the step of removing the copper foil, only the copper foil located at areas where the electronic component is mounted is left, and wherein, in the step of forming the insulating resin layer, openings are formed in the insulating resin layer such that the remaining copper foil becomes partially exposed to thus form a heat radiation section.

7. The method for manufacturing a multilayer wiring substrate mounted with an electronic component according to claim 4, wherein two stacked semiconductor chips are used as the electronic component, wherein electrode terminals formed on an upper surface of an upper semiconductor chip is electrically connected to the connection conductor sections by means of bonding wires, wherein connection terminals formed on a lower surface of a lower semiconductor chip are bonded to the copper foil, and the copper foil is subsequently patterned, to thus form a wiring pattern to be connected to the connection terminals of the lower semiconductor chip.

8. A method for manufacturing a multilayer wiring substrate mounted with an electronic component, comprising:

preparing a plate-like core material layer having a wiring and a first opening, the wiring including a plurality of connection conductor sections formed around the first opening on one surface of the core material layer;

forming, on the one surface of the core material layer, a resin layer having a second opening which is greater than the first opening in such a way that the plurality of connection conductor sections are exposed within the second opening;

bonding a supporting layer to the other surface of the core material layer, wherein a copper foil is used as the supporting layer;

mounting the electronic component on a surface of the supporting layer within the first opening;

electrically connecting the electronic component to the plurality of connection conductor sections by means of bonding wires;

filling the first and second openings with a resin in order to seal the electronic component and the bonding wires;

removing all of the copper foil; and forming an insulating resin layer on both surfaces of the substrate after removal of all of the copper foil.

9. A method for manufacturing a multilayer wiring substrate mounted with an electronic component, comprising:

preparing a plate-like core material layer having a wiring and a first opening, the wiring including a plurality of connection conductor sections formed around the first opening on one surface of the core material layer;

forming, on the one surface of the core material layer, a resin layer having a second opening which is greater than the first opening in such a way that the plurality of connection conductor sections are exposed within the second opening;

bonding a supporting layer to the other surface of the core material layer, wherein a copper foil is used as the supporting layer;

mounting the electronic component on a surface of the supporting layer within the first opening;

electrically connecting the electronic component to the plurality of connection conductor sections by means of bonding wires;

filling the first and second openings with a resin in order to seal the electronic component and the bonding wires;

removing the copper foil; and forming an insulating resin layer on both surfaces of the substrate after removal of the copper foil, wherein, in the step of removing the copper foil, only the copper foil located at areas where the electronic component is mounted is left, and wherein, in the step of forming the insulating resin layer, openings are formed in the insulating resin layer such that the remaining copper foil becomes partially exposed to thus form a heat radiation section.

* * * * *